(12) United States Patent
He et al.

(10) Patent No.: US 11,527,557 B2
(45) Date of Patent: Dec. 13, 2022

(54) ARRAY SUBSTRATE AND DISPLAY DEVICE

(71) Applicant: Shenzhen China Star Optoelectronics Semiconductor Display Technology Co., Ltd., Shenzhen (CN)

(72) Inventors: Xiaojin He, Shenzhen (CN); Chengcai Dong, Shenzhen (CN); Ilgon Kim, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 246 days.

(21) Appl. No.: 16/765,186

(22) PCT Filed: Apr. 21, 2020

(86) PCT No.: PCT/CN2020/085980
§ 371 (c)(1),
(2) Date: May 19, 2020

(87) PCT Pub. No.: WO2021/203482
PCT Pub. Date: Oct. 14, 2021

(65) Prior Publication Data
US 2022/0115414 A1 Apr. 14, 2022

(30) Foreign Application Priority Data
Apr. 9, 2020 (CN) .......................... 202010272733.6

(51) Int. Cl.
*H01L 27/12* (2006.01)
*G02F 1/1345* (2006.01)
(Continued)

(52) U.S. Cl.
CPC ........ *H01L 27/1248* (2013.01); *G02F 1/1368* (2013.01); *G02F 1/13458* (2013.01); *H01L 25/167* (2013.01); *H01L 27/124* (2013.01)

(58) Field of Classification Search
CPC ... H01L 25/167; H01L 25/18; H01L 25/0756; H01L 25/9753; H01L 27/1248;
(Continued)

(56) References Cited

U.S. PATENT DOCUMENTS 7,868,989 B2 * 1/2011 Yokota .................. H05K 1/111
349/150
8,780,310 B2 * 7/2014 Moriwaki ......... G02F 1/136204
348/149
(Continued)

FOREIGN PATENT DOCUMENTS

CN 108334240 7/2018
CN 210073288 2/2020

*Primary Examiner* — Nikolay K Yushin
(74) *Attorney, Agent, or Firm* — PV IP PC; Wei Te Chung; Ude Lu

(57) ABSTRACT

The present application provides an array substrate and a display device. The array substrate includes a first conductive layer, a second conductive layer, and an insulating layer. The first conductive layer includes at least two first conductive members disposed side by side in the bonding area. The second conductive layer includes at least two second conductive members; each of the second conductive members is provided corresponding to and electrically connected to each of the first conductive members, and at least two of the second conductive members and at least two of the first conductive members are electrically connected through a same via-hole on the insulating layer.

16 Claims, 4 Drawing Sheets

(51) Int. Cl.
*G02F 1/1368* (2006.01)
*H01L 25/16* (2006.01)

(58) Field of Classification Search
CPC .............. H01L 27/124; H01L 27/3265; H01L 27/3262; H01L 27/1359; H01L 25/0753; G02F 1/13458; G02F 1/1368; G02F 1/13338; G02F 1/136202; G02F 1/1333
See application file for complete search history.

(56) References Cited

U.S. PATENT DOCUMENTS 9,099,357 B2 * 8/2015 Ono ................... G02F 1/134336
10,559,597 B1 * 2/2020 Li ....................... H01L 27/1255

* cited by examiner

ARRAY SUBSTRATE AND DISPLAY DEVICE

RELATED APPLICATIONS

This application is a National Phase of PCT Patent Application No. PCT/CN2020/085980 having International filing date of Apr. 21, 2020, which claims the benefit of priority of Chinese Patent Application No. 202010272733.6 filed on Apr. 9, 2020. The contents of the above applications are all incorporated by reference as if fully set forth herein in their entirety.

FIELD AND BACKGROUND OF THE INVENTION

The present application relates to the field of display technology, in particular to an array substrate and a display device.

There is a great demand for conduction capability of bonding lead used for inputting a clock signal (CK) to a gate driving circuit (gate on array, GOA) in a high-resolution display device, such as a display device with a resolution of 7680×4320.

Shown in FIG. 1 is a schematic plan view of a conventional bonding lead for inputting a clock signal (CK). Each bonding lead includes a rectangular metal pattern 11 and four transparent slit-shaped conductive patterns 12 corresponding to and electrically connected to the rectangular metal pattern 11. Each transparent slit-shaped conductive pattern 12 and the rectangular metal pattern 11 are electrically connected through a slit-shaped via-hole 10a. There is an insulating layer between two adjacent rectangular metal patterns 11, and there is an insulating layer between two adjacent transparent slit-shaped conductive patterns 12. The bonding lead is used for inputting the clock signal (CK). Since an effective contact area of each transparent conductive pattern 12 and the rectangular metal pattern 11 is small (equal to an area of the slit-shaped via-hole 10a), this results in a large on-resistance of the bonding lead, which cannot satisfy driving demand of the high-resolution display device.

Therefore, it is necessary to propose a technical solution to solve the problem that the bonding leads traditionally used for inputting clock signals (CKs) have large on-resistance.

The purpose of the present application is to provide an array substrate and a display device to solve the problem of large on-resistance in the conventional bonding lead for inputting clock signals (CKs).

SUMMARY OF THE INVENTION

To achieve the above purpose, the present application provides an array substrate including a bonding area. The array substrate includes a first conductive layer, a second conductive layer, and an insulating layer disposed between the first conductive layer and the second conductive layer. The first conductive layer includes at least two first conductive members disposed side by side in the bonding area. The second conductive layer includes at least two second conductive members disposed side by side in the bonding area. Each of the second conductive members is provided corresponding to and electrically connected to each of the first conductive members, and at least two of the second conductive members adjacent to each other and at least two of the first conductive members adjacent to each other are electrically connected through a same via-hole on the insulating layer.

On the array substrate, an orthographic projection of each of the second conductive members on the array substrate is positioned within an orthographic projection of the via-hole on the array substrate.

On the array substrate, the size of the via-hole along a longitudinal direction of each of the first conductive members is less than or equal to the length of each of the first conductive members.

On the array substrate, a width of each of the first conductive members is equal to a width of each of the second conductive members corresponding to and electrically connected to each of the first conductive members.

On the array substrate, the array substrate includes a plurality of leads, each of the plurality of leads includes one of the first conductive members and one of the second conductive members electrically connected to the first conductive members, the plurality of leads include a first lead configured to be input with a clock signal and second leads configured to be input with a low-frequency signal, and the second leads are disposed on opposite sides of the first lead, or/and the plurality of leads include a third lead configured to be input with a data signal.

On the array substrate, a preparation material of the first conductive layer is selected from at least one of molybdenum, aluminum, titanium, and copper, and a preparation material of the second conductive layer includes indium tin oxide or indium zinc oxide.

On the array substrate, a thickness of the insulating layer is 1000-6000 angstroms and a preparation material of the insulating layer is selected from at least one of silicon nitride and silicon oxide.

On the array substrate, the array substrate further includes a bonding member bound to the bonding area, the bonding member includes a plurality of conductive terminals, and each of the conductive terminals is electrically connected to one of the second conductive members.

On the array substrate, a gap width between two of the second conductive members adjacent to each other is 6-12 μm, each of the second conductive members has a width of 50-150 μm, and each of the second conductive members has a length of 400-800 μm.

On the array substrate, at least two of the second conductive members and at least two of the first conductive members are electrically connected through the same via-hole on the insulating layer.

A display device, including an array substrate, the array substrate is provided with a bonding area, the array substrate includes a first conductive layer, a second conductive layer, and an insulating layer disposed between the first conductive layer and the second conductive layer. The first conductive layer includes at least two first conductive members disposed side by side in the bonding area. The second conductive layer includes at least two second conductive members disposed side by side in the bonding area. Each of the second conductive members is provided corresponding to and electrically connected to each of the first conductive members, and at least two of the second conductive members adjacent to each other and at least two of the first conductive members adjacent to each other are electrically connected through a same via-hole on the insulating layer.

In the display device, an orthographic projection of each of the second conductive members on the array substrate is positioned within an orthographic projection of the via-hole on the array substrate.

In the above display device, a size of the via-hole along a longitudinal direction of each of the first conductive members is less than or equal to a length of each of the first conductive members.

In the above display device, a width of each of the first conductive members is equal to a width of each of the second conductive members corresponding to and electrically connected to each of the first conductive members.

In the display device, the array substrate includes a plurality of leads, and each of the plurality of leads includes one of the first conductive members and one of the second conductive members electrically connected to the first conductive member, the plurality of leads include a first lead configured to be input with a clock signal and a second lead configured to be input with a low-frequency signal, and the second leads are disposed on opposite sides of the first lead, or/and the plurality of leads include a third lead configured to be input with a data signal.

In the display device, a preparation material of the first conductive layer is selected from at least one of molybdenum, aluminum, titanium, and copper, and a preparation material of the second conductive layer includes indium tin oxide or indium zinc oxide.

In the display device, a thickness of the insulating layer is 1000-6000 angstroms, and a preparation material of the insulating layer is selected from at least one of silicon nitride and silicon oxide.

In the display device, the array substrate further includes a bonding member bound to the bonding area, the bonding member includes a plurality of conductive terminals, and each of the conductive terminals is electrically connected to one of the second conductive members.

In the display device, a gap width between two of the second conductive members adjacent to each other is 6-12 µm, each of the second conductive members has a width of 50-150 µm, and each of the second conductive members has a length of 400-800 µm.

In the display device, at least two of the second conductive members and at least two of the first conductive members are electrically connected through the same via-hole on the insulating layer.

The first conductive layer includes at least two first conductive members disposed side by side in the bonding area. The second conductive layer includes at least two second conductive members positioned in the bonding area, each of the second conductive members is provided corresponding to and electrically connected to each of the first conductive members, and at least two of the adjacent second conductive members and at least two of the adjacent first conductive members are electrically connected through the same via-hole on the insulating layer. Compared with the prior art, the present application removes the insulating layer between two adjacent second conductive members, so that the effective contact area between each of the first conductive members and the second conductive members is greater, and the impedance is reduced. Moreover, the second conductive member would not be formed on the sidewall of the insulating layer between two adjacent second conductive members, thereby preventing risks including cracking of the second conductive member.

DESCRIPTION OF SPECIFIC EMBODIMENTS OF THE INVENTION

The technical solutions in the embodiments of the present application will be described clearly and completely with reference to the drawings in the embodiments of the present application. Obviously, the embodiments are only a part of the embodiments of the present application, but not all the embodiments. Based on the embodiments in the present application, all other embodiments obtained by those skilled in the art without doing creative work fall within the protection scope of the present application.

Figure 2:
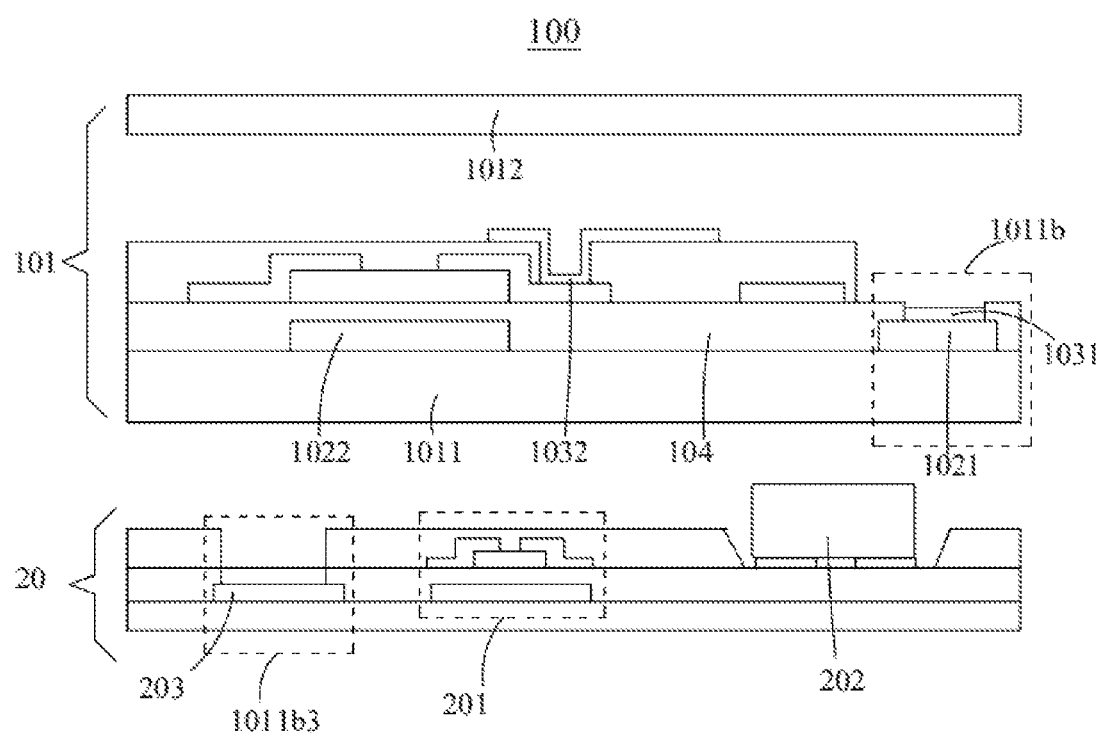
FIG. 2 is a schematic diagram of a display device according to an embodiment of the present application.

Please refer to FIG. 2, which is a schematic diagram of a display device according to an embodiment of the present application. The display device 100 includes a display panel 101 and a backlight module 20. The display panel 101 is a liquid crystal display panel. The display panel 101 includes an array substrate 1011, a color filter substrate 1012 disposed opposite to the array substrate 1011, and a liquid crystal layer disposed between the array substrate 1011 and the color filter substrate 1012. It can be understood that the display device 100 may also be an organic light-emitting diode display panel. The display device 100 may also be an inorganic light-emitting diode display panel.

Figure 3:
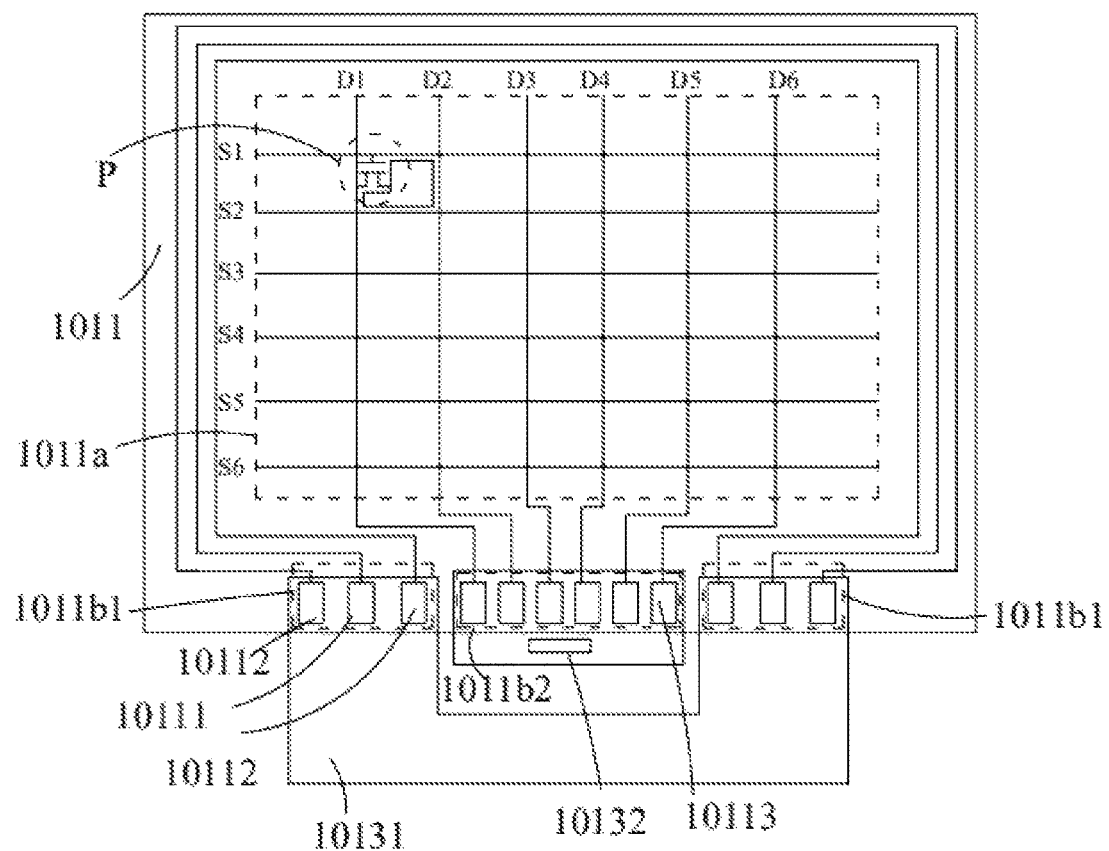
FIG. 3 is a schematic plan view of an array substrate of the display panel shown in FIG. 2.

Please refer to FIG. 3, which is a schematic plan view of an array substrate of the display panel shown in FIG. 2. The array substrate 1011 includes a display area 1011a and a bonding area 1011b positioned outside the display area 1011a. The display area 1011a of the array substrate 1011 is provided with a plurality of parallel scanning lines S, a plurality of parallel data lines D, and a plurality of pixel circuits P, and each pixel circuit P includes at least one thin film transistor.

The bonding area 1011b of the array substrate 1011 includes a plurality of leads. The plurality of leads are used to bond with bonding members to achieve signal transmission. The bonding area 1011b includes a first bonding area 1011b1 and a second bonding area 1011b2. Two of the first bonding areas 1011b1 are disposed on opposite sides of the second bonding area 1011b2. The plurality of leads includes a first lead 10111 configured to be input with a clock signal (CK) and a second lead 10112 configured to be input with a low-frequency signal (such as a VSS signal). The second lead 10112 is disposed on opposite sides of the first lead 10111. The first lead 10111 and the second lead 10112 are arranged side by side in the first bonding area 1011b1. The first lead 10111 and the second lead 10112 are disposed side by side in the first bonding area 1011b1. The plurality of leads include a third lead 10113 for transmitting data signals. The third lead 10113 is disposed side by side in the second bonding area 1011b2, and the third lead 10113 is electrically connected to the data line D.

The array substrate 1011 further includes a bonding member that is bound to the bonding area 1011b. The bonding member includes a plurality of conductive terminals, each conductive terminal corresponds to a lead, and they are connected by an anisotropic conductive adhesive. Each conductive terminal is electrically connected to a second conductive member. The bonding member includes a first bonding member 10131 and a second bonding member 10132. The first bonding member 10131 is a flexible printed circuit board, and the first bonding member 10131 is bound to the first bonding area 1011*b*1. The second bonding member 10132 is a chip-on-film or a source driving chip, and the second bonding member 10132 is bound to the second bonding area 1011*b*2.

The array substrate 1011 further includes a first conductive layer, a second conductive layer, and an insulating layer 104 disposed between the first conductive layer and the second conductive layer.

Figure 4:
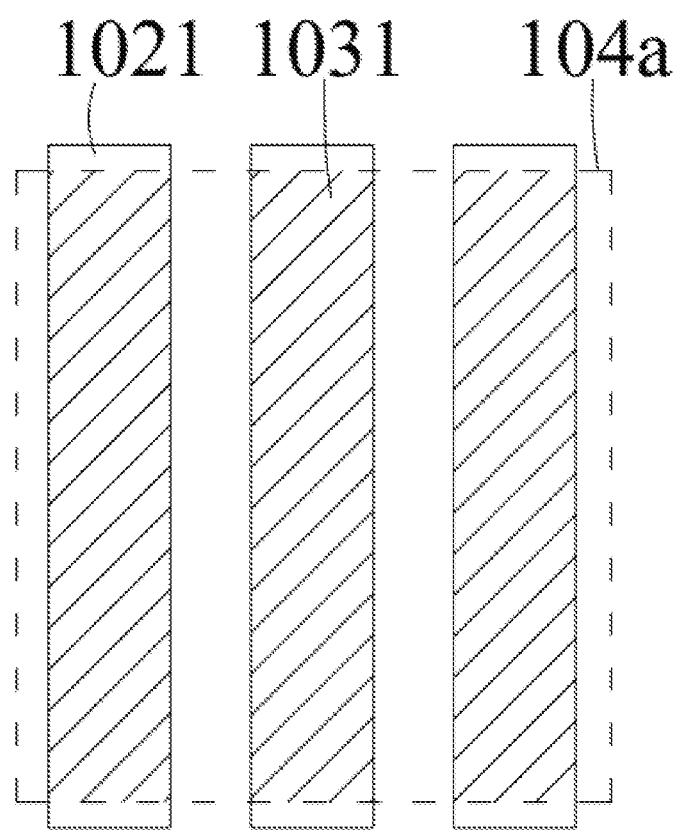
FIG. 4 is a partially enlarged schematic view of a bonding area of the display panel.

Please refer to FIG. 2, FIG. 3, and FIG. 4 together. FIG. 4 is a partially enlarged schematic view of the bonding area of the display panel. The first conductive layer includes at least two first conductive members 1021 disposed side by side in the bonding area 1011*b*. The first conductive layer further includes a scan line S and a gate 1022 in the display area 100*a*. Preparation material of the first conductive layer is selected from at least one of molybdenum, aluminum, titanium, or copper. A thickness of the first conductive layer is 2500-3500 angstroms. A gap width between two adjacent first conductive members 1021 is 8-12 µm, for example, the gap width between two adjacent first conductive members 1021 is 8 µm. A length of each first conductive member 1021 is 500 to 800 µm, for example, 500 µm, 550 µm, 650 µm, 680 µm, and 750 µm. A width of each first conductive member 1021 is 50-150 µm, for example, 60 µm, 80 µm, 90 µm, 130 µm, and 150 µm. The plurality of first conductive members 1021 are disposed side by side along a width direction of the first conductive members 1021.

In this embodiment, the second conductive layer includes at least two second conductive members 1031 positioned in the bonding area 1011*b*, and the second conductive layer further includes a pixel electrode 1032 positioned in the display area 1011*a*. At least two second conductive members 1031 are disposed side by side. Each second conductive member 1031 is corresponding to each first conductive member 1021 and they are electrically connected. The second conductive layer is made of indium tin oxide or indium zinc oxide. A thickness of the second conductive layer is 600-1000 angstroms. A gap width between two adjacent second conductive members 1031 is 6-12 µm, and a width of each second conductive member 1031 is 50-150 µm, for example, 60 µm, 80 µm, 100 µm, 120 µm, and 140 µm. A length of each second conductive member 1031 is 400-800 µm, for example, 450 µm, 500 µm, 600 µm, and 680 µm.

In this embodiment, the width of the first conductive member 1021 is equal to the width of the second conductive member 1031 corresponding to and electrically connected to the first conductive member 1021, so that the contact area of the first conductive member and the second conductive member in the width direction is maximized, and the on-resistance is reduced.

In this embodiment, at least two adjacent second conductive members 1031 and at least two adjacent first conductive members 1021 are electrically connected through the same via-hole 104*a* on the insulating layer 104. A shape of the via-hole 104*a* is rectangular. The insulating layer 104 is a gate insulating layer, and a thickness of the insulating layer 104 is 1000-6000 angstroms. Preparation material of the insulating layer 104 is selected from at least one of silicon nitride or silicon oxide. Specifically, at least two second conductive members and at least two first conductive members are electrically connected through the same via-hole 104*a* on the insulating layer 104.

Figure 1:
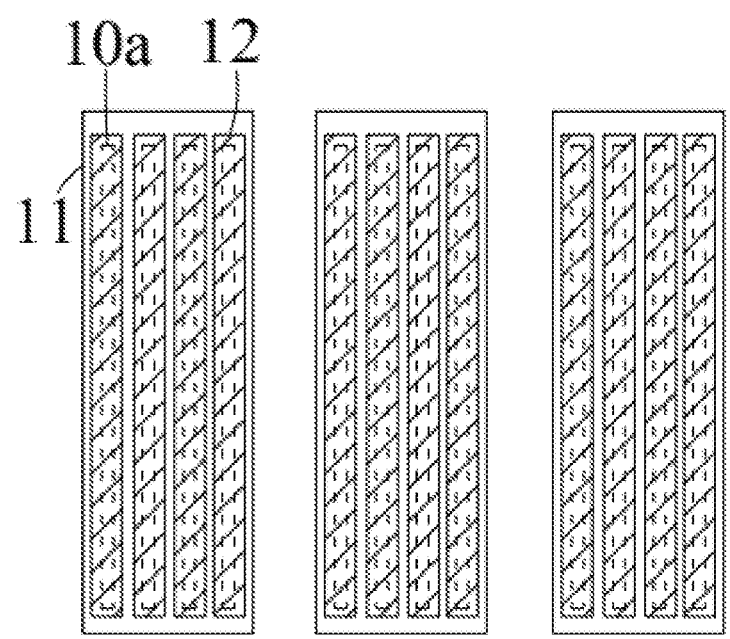
FIG. 1 is a schematic plan view of a conventional bonding lead for inputting a clock signal (CK).

At least two adjacent second conductive members 1031 and at least two adjacent first conductive members 1021 are electrically connected through the same via-hole 104*a* on the insulating layer 104, so that there is no insulating layer between two adjacent second conductive members 1031. Compared with the effective contact area between the transparent slit-shaped conductive pattern and the rectangular metal pattern of the bonding lead shown in FIG. 1 being dependent on the area of the slit-shaped hole, the present application increases the effective contact area between the first conductive member 1021 and the second conductive member 1031. Conduction impedance between the first conductive member 1021 and the second conductive member 1031 is reduced, conduction capability is improved, and capability to transmit electrical signals is also improved, thereby meeting requirements of the leads in the 1G1D architecture 8K display device. In addition, compared to the conventional technology, the insulating layer 104 between two adjacent second conductive members 1031 is removed so that the second conductive member 1031 does not need to be formed on an inner wall of the via-hole forming the insulating layer 104, thereby preventing problems such as breakage of the second conductive member 1031 when a slope of the inner wall is greater than 90 degrees, which affects transmission of electrical signals. 1G1D means that a same row of sub-pixels in the display area of the display panel is electrically connected to a same scanning line, and a same column of sub-pixels is connected to a same data line.

In this embodiment, an orthographic projection of each second conductive member 1031 on the array substrate 1011 is positioned in an orthographic projection of the via-hole 104*a* on the array substrate 1011, thereby preventing the second conductive member 1031 from being formed on the inner wall surrounding the via-hole 104*a*, and preventing the second conductive member 1031 from breaking when the slope of the inner wall is greater than 90 degrees and affecting electrical signal transmission between the bonding member and the second conductive member 1031.

In this embodiment, a dimension of the via-hole 104*a* along the longitudinal direction of the first conductive member 1021 is less than or equal to the length of the first conductive member 1021, so that the effective contact area of the first conductive member 1021 and the second conductive member 1031 to be formed later depend on the area of the second conductive member 1031. It is beneficial to improve uniformity of the contact area between the second conductive member 1031 and the first conductive member 1021 as well as process stability.

In this embodiment, each lead includes a first conductive member 1021 and a second conductive member 1031 electrically connected to the first conductive member 1021. Each first lead 10111, each second lead 10112 and each third lead 10113 are composed of a first conductive member 1021 and a second conductive member 1031 electrically connected to the first conductive member 1021, wherein the first conductive member 1021 constituting the third lead 10113 is connected to the data line D of the display area 1011*a* through the via-hole on the insulating layer 104.

In this embodiment, the backlight module 20 includes an array substrate. The array substrate includes thin-film transistors 201 arranged in an array and sub-millimeter light-emitting diodes 202 (mini-LEDs) arranged in an array. The thin-film transistor 201 is configured to control switching state of the sub-millimeter light-emitting diode 202 and magnitude of a driving current. As shown in FIG. 2, the backlight module 20 further includes a third bonding area 1011*b*3, the third bonding area 1011*b*3 is provided with a plurality of fourth leads 203, the plurality of fourth leads 203 are electrically connected to a driving chip (not shown), and the driving chip transmits a driving signal to the thin-film transistor through the fourth lead 203 to control the driving current value of the sub-millimeter light-emitting diode 202. Each fourth lead 203 includes a first conductive member 1021 and a second conductive member 1031 electrically connected to the first conductive member 1021. The first conductive member 1021 and the second conductive member 1031 of the plurality of fourth leads 203 are electrically connected through the same via-hole so that conduction capability of the fourth lead 203 is improved, and luminous effect of the backlight module 20 is improved.

The description of the embodiments is only used to help understand the technical solutions and core ideas of the present application. Those of ordinary skill in the art should understand the technical solutions described in the embodiments can be modified, or some of the technical features can be equivalently substituted. However, these modifications or substitutions do not deviate from the scope of the technical solutions in the embodiments of the present application.

What is claimed is:

1. An array substrate, comprising a bonding area provided with leads, the array substrate comprising a first conductive layer, a second conductive layer, and an insulating layer disposed between the first conductive layer and the second conductive layer, wherein the first conductive layer comprises a first conductive member in the bonding area, and the second conductive layer comprises a second conductive member corresponding to the first conductive member and electrically connected to the first conductive member in the bonding area;
   wherein one of the leads comprises the first conductive member and the second conductive member; and
   wherein the leads comprise a first lead configured to be input with a clock signal and second leads disposed on opposite sides of the first lead and configured to be input with a low-frequency signal, or/and
   the leads comprise a third lead configured to be input with a data signal.

2. The array substrate according to claim 1, wherein an orthographic projection of the second conductive member on the array substrate is positioned within an orthographic projection of a via-hole on the array substrate.

3. The array substrate according to claim 1, wherein a size of a via-hole along a longitudinal direction of the first conductive member is less than or equal to a length of the first conductive member.

4. The array substrate according to claim 1, wherein a width of the first conductive member is equal to a width of the second conductive member corresponding to and electrically connected to the first conductive member.

5. The array substrate according to claim 1, wherein a preparation material of the first conductive layer is selected from at least one of molybdenum, aluminum, titanium, or copper, and a preparation material of the second conductive layer comprises indium tin oxide or indium zinc oxide.

6. The array substrate according to claim 1, wherein a thickness of the insulating layer is 1000-6000 angstroms, and a preparation material of the insulating layer is selected from at least one of silicon nitride or silicon oxide.

7. The array substrate according to claim 1, wherein the array substrate further comprises a bonding member bound to the bonding area, the bonding member comprises a conductive terminal electrically connected to the second conductive member.

8. The array substrate according to claim 1, wherein the second conductive member has a width of 50-150 μm, and the second conductive member has a length of 400-800 μm.

9. A display device, comprising an array substrate, the array substrate comprising a bonding area provided with leads, the array substrate comprising a first conductive layer, a second conductive layer, and an insulating layer disposed between the first conductive layer and the second conductive layer, wherein the first conductive layer comprises a first conductive member in the bonding area, and the second conductive layer comprises a second conductive member corresponding to the first conductive member and electrically connected to the first conductive member in the bonding area;
   wherein the leads comprises the first conductive member and the second conductive member; and
   wherein the leads comprise a first lead configured to be input with a clock signal and second leads disposed on opposite sides of the first lead and configured to be input with a low-frequency signal, or/and
   the leads comprise a third lead configured to be input with a data signal.

10. The display device according to claim 9, wherein an orthographic projection of the second conductive member on the array substrate is positioned within an orthographic projection of a via-hole on the array substrate.

11. The display device according to claim 9, wherein a size of a via-hole along a longitudinal direction of the first conductive member is less than or equal to a length of the first conductive member.

12. The display device according to claim 9, wherein a width of the first conductive member is equal to a width of the second conductive member corresponding to and electrically connected to the first conductive member.

13. The display device according to claim 9, wherein a preparation material of the first conductive layer is selected from at least one of molybdenum, aluminum, titanium, or copper, and a preparation material of the second conductive layer comprises indium tin oxide or indium zinc oxide.

14. The display device according to claim 9, wherein a thickness of the insulating layer is 1000-6000 angstroms, and a preparation material of the insulating layer is selected from at least one of silicon nitride or silicon oxide.

15. The display device according to claim 9, wherein the array substrate further comprises a bonding member bound to the bonding area, the bonding member comprises a conductive terminal is electrically connected to the second conductive member.

16. The display device according to claim 9, wherein the second conductive member has a width of 50-150 μm, and the second conductive member has a length of 400-800 μm.

* * * * *